United States Patent
Kakuyama et al.

(10) Patent No.: US 12,389,796 B2
(45) Date of Patent: Aug. 12, 2025

(54) OPTICAL SENSOR

(71) Applicant: Sumitomo Electric Industries, Ltd., Osaka (JP)

(72) Inventors: Kyohei Kakuyama, Osaka (JP); Kotaro Hirose, Osaka (JP); Masahiro Adachi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 471 days.

(21) Appl. No.: 18/070,505

(22) Filed: Nov. 29, 2022

(65) Prior Publication Data
US 2023/0255114 A1  Aug. 10, 2023

(30) Foreign Application Priority Data

Feb. 8, 2022 (JP) .............................. 2022-017812

(51) Int. Cl.
*H10N 10/17* (2023.01)
*G01J 5/14* (2006.01)
*G01J 5/10* (2006.01)

(52) U.S. Cl.
CPC ............... *H10N 10/17* (2023.02); *G01J 5/14* (2013.01); *G01J 2005/103* (2013.01)

(58) Field of Classification Search
None
See application file for complete search history.

(56) References Cited

U.S. PATENT DOCUMENTS

| | | |
|---|---|---|
| 2008/0271772 A1 | 11/2008 | Leonov et al. |
| 2011/0155202 A1 | 6/2011 | Arnold et al. |
| 2015/0380625 A1 | 12/2015 | Freer et al. |
| 2017/0356806 A1 | 12/2017 | Takahashi et al. |
| 2019/0252462 A1 | 8/2019 | Spaziani et al. |
| 2020/0403136 A1 | 12/2020 | Adachi et al. |
| 2021/0167270 A1 | 6/2021 | Adachi et al. |
| 2022/0384703 A1 | 12/2022 | Ghoshal |
| 2024/0147860 A1 | 5/2024 | Kakuyama et al. |

FOREIGN PATENT DOCUMENTS

| | | |
|---|---|---|
| JP | H09-092892 A | 4/1997 |
| JP | 2884679 B2 | 4/1999 |
| JP | 2009-210289 A | 9/2009 |
| JP | 2014-007225 A | 1/2014 |
| JP | 2015-135939 A | 7/2015 |

(Continued)

OTHER PUBLICATIONS

Office Action issued on Mar. 13, 2024, in corresponding U.S. Appl. No. 18/279,599, 30 pages.

(Continued)

*Primary Examiner* — Benjamin P Sandvik
(74) *Attorney, Agent, or Firm* — XSENSUS LLP

(57) ABSTRACT

An optical sensor includes a support film, a thermoelectric conversion material portion, a heat sink, a light absorption film, a first electrode, and a second electrode. The thermoelectric conversion material portion includes a plurality of first material layers and a plurality of second material layers. The support film includes a first layer arranged on the heat sink side in a thickness direction and configured with a phononic structure having a large number of holes, and an insulating second layer arranged on the first layer and in contact with the thermoelectric conversion material portion.

18 Claims, 9 Drawing Sheets

(56) References Cited

FOREIGN PATENT DOCUMENTS

| | | |
|---|---|---|
| JP | 2017-223644 A | 12/2017 |
| JP | 2018-537848 A | 12/2018 |
| WO | 2017/068527 A1 | 4/2017 |
| WO | 2019/171915 A1 | 9/2019 |
| WO | 2020/049852 A1 | 3/2020 |
| WO | 2020/213569 A1 | 10/2020 |
| WO | 2021/002221 A1 | 1/2021 |
| WO | 2021/039074 A1 | 3/2021 |

OTHER PUBLICATIONS

Tambo et al., "Sensitivity improved thermal infrared sensor cell applying the heat insulating phononic crystals" Image Sensing Technologies: Materials, Devices, Systems, and Applications VIII. Proceedings of SPIE vol. 11723, 2021, pp. 1172306-1-1172306-8.

OPTICAL SENSOR

CROSS-REFERENCE TO RELATED APPLICATION

The present application claims priority based on Japanese Patent Application No. 2022-017812 filed Feb. 8, 2022, the entire contents of which are incorporated herein by reference.

BACKGROUND OF THE INVENTION

1. Field of the Invention

The present invention relates to an optical sensor.

2. Description of the Related Art

A thermoelectric conversion element having thermoelectric conversion materials composed of compound semiconductors is know (see, e.g., Patent Literature 1 and Patent Literature 2). An infrared sensor using a phononic structure is also known (see, e.g., Non-Patent Literature 1).

CITATION LIST

Patent Literature

Patent Literature 1: international Publication WO 2021/039074
Patent Literature 2: Japanese Patent Application Laid-Open No. 2017-223644

Non-Patent Literature

Non-Patent Literature 1: Tambo, Naoki, et al., "Sensitivity improved thermal infrared sensor cell applying the heat insulating phononic crystals", Image Sensing Technologies: Materials, Devices, Systems, and Applications VIE. Vol. 11723, International Society for Optics and Photonics, 2021

SUMMARY OF THE INVENTION

An optical sensor according to the present disclosure includes: a support film; a thermoelectric conversion material portion arranged on one main surface of the support film and operative to convert thermal energy into electrical energy; a heat sink arranged on another main surface of the support a light absorption film operative to convert light energy of received light into thermal energy; a first electrode electrically connected to the thermoelectric conversion material portion; and a second electrode arranged separate from the first electrode and electrically connected to the thermoelectric conversion material portion. The thermoelectric conversion material portion includes a plurality of strip-shaped first material layers formed of SiGe having a first conductivity type and operative to convert thermal energy into electrical energy, and a plurality of strip-shaped second material layers formed of SiGe having a second conductivity type different from the first conductivity type and operative to convert thermal energy into electrical energy. Each first material layer includes a first region including a first end located on one side in a longitudinal direction, and a second region including a second end located on another side in the longitudinal direction. Each second material layer includes a third region including a third end located on one side in a longitudinal direction, and a fourth region including a fourth end located on another side in the longitudinal direction. The first electrode is electrically connected to the first region of one of the plurality of first material layers. The second electrode is electrically connected to the third region of one of the plurality of second material layers. The plurality of first material layers and the plurality of second material layers are alternately arranged in series in such a manner that, except for the first region of the first material layer connected to the first electrode and the third region of the second material layer connected to the second electrode, the first region and the third region are electrically connected to each other and the second region and the fourth region are electrically connected to each other. The light absorption film is arranged to form a temperature difference in the longitudinal direction in each of the first and second material layers. The support film includes a first layer arranged on the heat sink side in a thickness direction and configured with a phononic structure having a large number of holes, and an insulating second layer arranged on the first layer and in contact with the thermoelectric conversion material portion.

DESCRIPTION OF THE PREFERRED EMBODIMENTS

Figure 1:
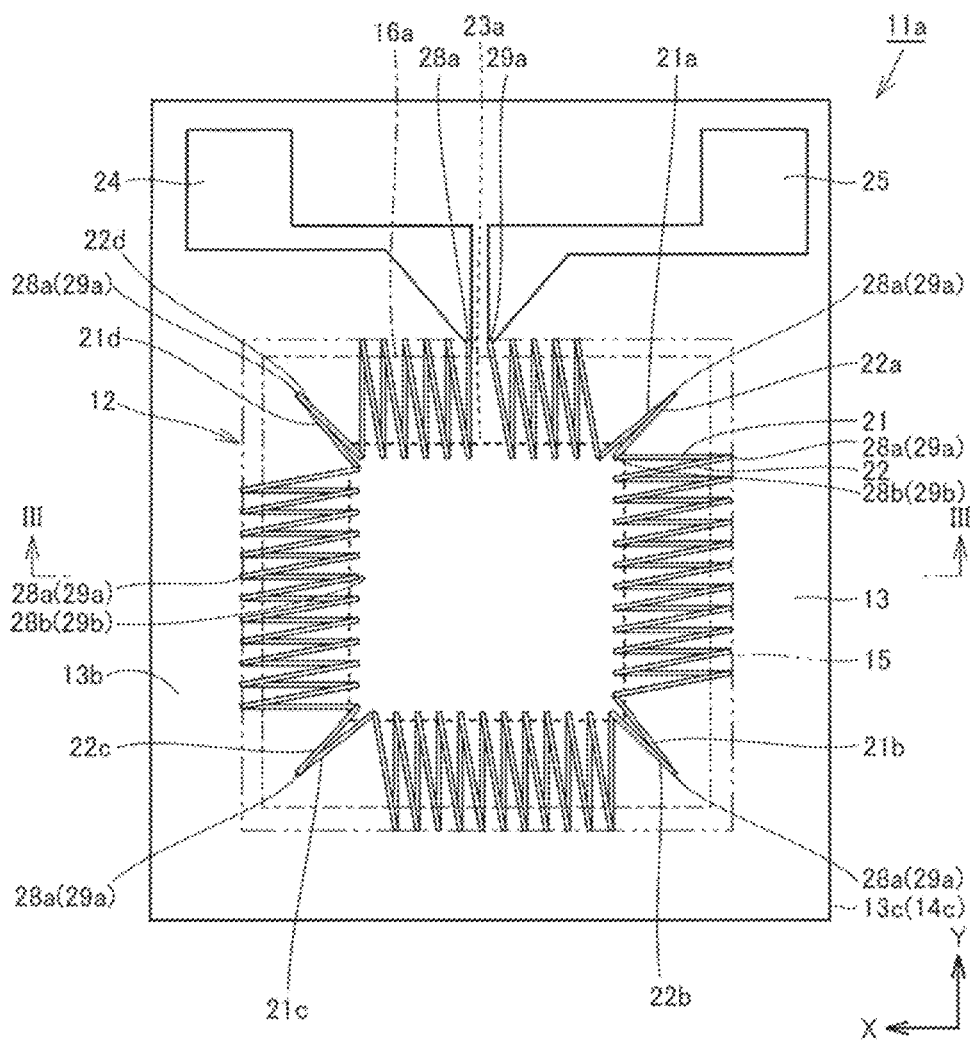
FIGS. 1 and 2 are schematic plan views of the appearance of an optical sensor in Embodiment 1.

Problems to be Solved by Present Disclosure

An optical sensor is required to be good in sensitivity. Therefore, one of the objects of the present disclosure is to provide an optical sensor with which the sensitivity can be improved.

Advantageous Effects of Present Disclosure

According to the optical sensor described above, the sensitivity can be improved.

DESCRIPTION OF EMBODIMENTS OF PRESENT DISCLOSURE

Firstly, embodiments of the present disclosure will be listed and described. An optical sensor according to the present disclosure includes: a support film; a thermoelectric conversion material portion arranged on one main surface of the support film and operative to convert thermal energy into electrical energy; a heat sink arranged on another main surface of the support film; a light absorption film operative to convert light energy of received light into thermal energy; a first electrode electrically connected to the thermoelectric conversion material portion; and a second electrode arranged separate from the first electrode and electrically connected to the thermoelectric conversion material portion. The thermoelectric conversion material portion includes a 75 plurality of strip-shaped first material layers formed of SiGe having a first conductivity type and operative to convert thermal energy into electrical energy, and a plurality of strip-shaped second material layers formed of SiGe having a second conductivity type different from the first conductivity type and operative to convert thermal energy into electrical energy. Each first material layer includes a first region including a first end located on one side in a longitudinal direction, and a second region including a second end located on another side in the longitudinal direction. Each second material layer includes a third region including a third end located on one side in a longitudinal direction, and a fourth region including a fourth end located on another side in the longitudinal direction. The first electrode is electrically connected to the first region of one of the plurality of first material layers. The second electrode is electrically connected to the third region of one of the plurality of second material layers. The plurality of first material layers and the plurality of second material layers are alternately arranged in series in such a manner that, except for the first region of the first material layer connected to the first electrode and the third region of the second material layer connected to the second electrode, the first region and the third region are electrically connected to each other and the second region and the fourth region are electrically connected to each other. The light absorption film is arranged to form a temperature difference in the longitudinal direction in each of the first and second material layers. The support film includes a first layer arranged on the heat sink side in a thickness direction and configured with a phononic structure having a large number of holes, and an insulating second layer arranged on the first layer and in contact with the thermoelectric conversion material portion.

A thermopile type optical sensor, such as an infrared sensor, using thermoelectric conversion materials that convert temperature differences (thermal energy) into electrical energy may include a light absorption film operative to convert light energy into thermal energy, and a thermoelectric conversion material portion (thermopile) operative to convert thermal energy into electrical energy. In the thermoelectric conversion material portion, a thermocouple may be used, for example, which is formed by connecting a thermoelectric conversion material portion of a first conductivity type, n type, and a thermoelectric conversion material portion of a second conductivity type, p type, different from the first conductivity type. A plurality of strip-shaped n-type thermoelectric conversion material portions and a plurality of strip-shaped p-type thermoelectric conversion material portions are alternately connected in series to increase the output. The sensitivity in an optical sensor is expressed by the expression shown in Math. 1 below.

$$D* = \frac{\eta \times n \times \alpha}{Gth} \qquad \text{[Math. 1]}$$

In the above expression, D* represents sensitivity, η represents emissivity, n represents the number of thermocouples, α represents Seebeck coefficient, and Gth represents thermal conductance. As understood from the expression, reduced thermal conductance leads to improved sensitivity in the optical sensor.

Here, the present inventors considered achieving reduction in thermal conductance of the optical sensor in order to improve the sensitivity of the optical sensor. They found that, among the components included in the optical sensor, the support film supporting the thermoelectric conversion material portion had large thermal conductivity, making it difficult to improve the sensitivity. Therefore, the present inventors focused on the point that the thermal conductivity of the support film should be reduced. They also found that according to the structure of Non-Patent Literature 1, the thermoelectric conversion material would enter into the holes, and it would be difficult to properly form the thermoelectric conversion material portion. The present inventors thus studied diligently and finally arrived at the structure of the present disclosure.

In the optical sensor according to the present disclosure, the support film includes the first layer arranged on the heat sink side in the thickness direction, and the insulating second layer arranged on the first layer and in contact with the thermoelectric conversion material portion. According to such a configuration, since the support film includes the insulating second layer, the support film can reliably support the thermoelectric conversion material portion arranged on the second layer. The first layer is configured with the phononic structure having a large number of holes. That the first layer included in the support film includes the phononic structure can reduce the thermal conductivity as the support film. As a result, the sensitivity can be improved with such an optical sensor. As used herein, the phononic structure refers to a structure that has a periodic structure on the nanometer order and artificially inhibits the propagation of phonons.

In the optical sensor described above, the second layer may be formed of a material containing Si. Such a material can easily secure insulating properties.

In the optical sensor described above, the second layer may be formed of $SiO_2$ or SiN. Such materials are suitable for the insulating second layer included in the support film of the optical sensor.

In the optical sensor described above, the second layer may have a thickness of more than 0 nm and not more than 200 nm, With this, the sensitivity can be improved while increasing the yield during the production of the optical sensor. It is therefore possible to achieve both improved sensitivity and good productivity of the optical sensor.

In the optical sensor described above, the thickness of the second layer may be not less than 10 nm and not more than 50 nm. This makes it possible to more reliably achieve both improved sensitivity and good productivity of the optical sensor.

In the optical sensor described above, either one or both of the first material layers and the second material layers may be formed of SiGe that has at least one of an amorphous structure and a nanocrystalline structure with a grain size of not less than 3 nm and not more than 200 nm. With this, the thermoelectric conversion efficiency can be improved, and thus, the sensitivity can be improved.

In the optical sensor described above, either one or both of the first material layers and the second material layers may be formed of polycrystalline SiGe. Such SiGe as a polycrystal is also suitably used in the optical sensor of the present disclosure. It should be noted that the polycrystal in the optical sensor of the present disclosure leas the crystallinity of 99% or more.

In the optical sensor described above, the phononic structure may be configured with an insulating film containing Si. The pitch spacing between the holes may be not less than 20 inn and not more than 200 nm. This can more reliably reduce the thermal conductivity in the phononic structure. Accordingly, the sensitivity of the optical sensor can be improved more reliably.

In the optical sensor described above, the holes may have a diameter of not less than 10 nm and not more than 100 nm. This can more reliably reduce the thermal conductivity in the phononic structure. Accordingly, the sensitivity of the optical sensor can be improved more reliably.

In the optical sensor described above, the thermoelectric conversion material portion may include a plurality of third material layers formed of metal. Each third material layers may be arranged to contact the first and third regions or to contact the second and fourth regions. In this case, the third material layers with good conductivity can improve the electrical conductivity between the first and second material layers. Accordingly, such a configuration can also improve the sensitivity of the optical sensor.

DETAILS OF EMBODIMENTS OF PRESENT DISCLOSURE

Embodiments of the optical sensor of the present disclosure will be described below with reference to the drawings. In the drawings referenced below, the same or corresponding portions are denoted by the same reference numerals and the description thereof will not be repeated.

Embodiment 1

Figure 2:
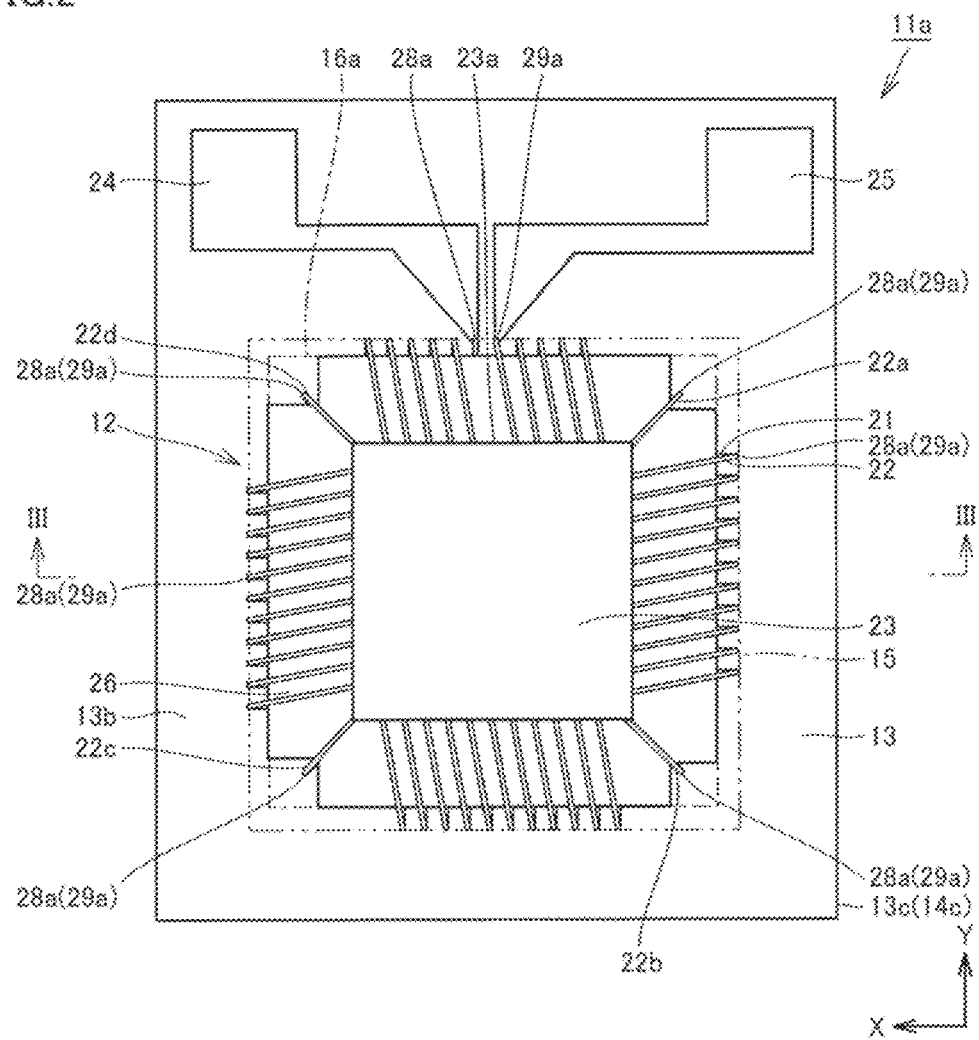
Figure 3:
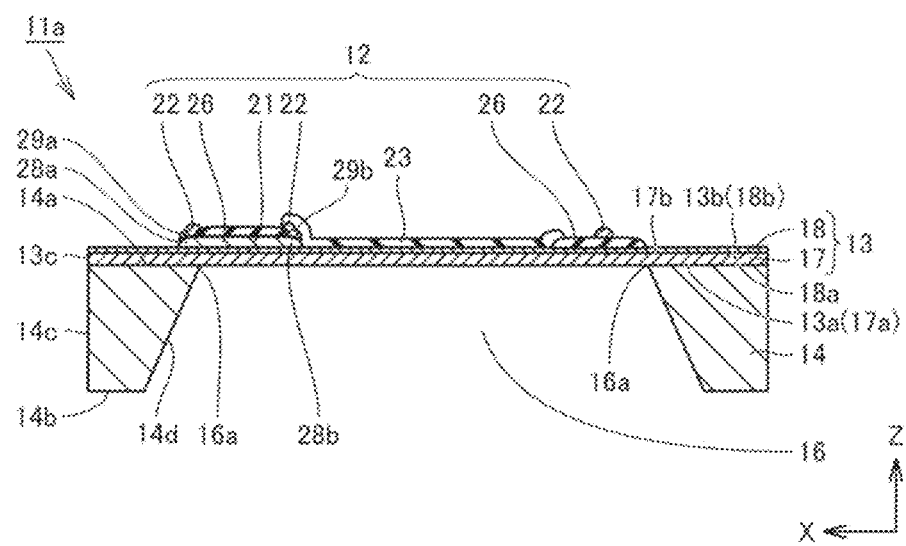
FIG. 3 is a schematic cross-sectional view taken along the line III-III in FIGS. 1 and 2.
Figure 4:
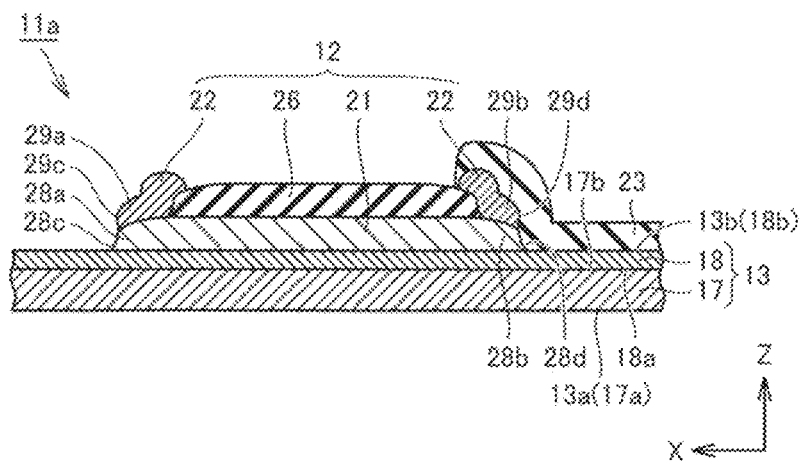
FIG. 4 is a schematic cross-sectional view of a portion of the optical sensor in Embodiment 1.
Figure 5:
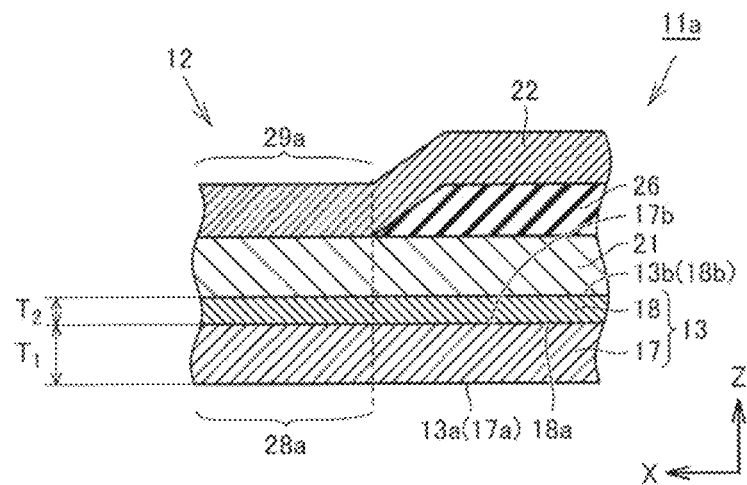
FIG. 5 is a schematic cross-sectional diagram showing in enlarged view a portion of the optical sensor shown in FIG. 4.

An optical sensor according to Embodiment 1 of the present disclosure will now be described. FIGS. 1 and 2 are schematic plan views of the appearance of the optical sensor in Embodiment 1. For ease of understanding, an infrared absorption film and an insulating film, which will be described later, are not illustrated in FIG. 1. In FIG. 1, the dashed line indicates an outer edge 23a of the infrared absorption film when disposed. FIG. 3 is a schematic cross-sectional view taken along the line III-III in FIGS. 1 and 2. FIG. 4 is a schematic cross-sectional view of a portion of the optical sensor in Embodiment 1. FIG. 4 is a schematic cross-sectional diagram showing in enlarged view a portion including first, second, third, and fourth regions, which will be described later. FIG. 5 is a schematic cross-sectional diagram showing in enlarged view a portion of the optical sensor shown in FIG. 4.

Referring to FIGS. 1 to 5, an optical sensor 11a is, for example, an infrared sensor. The optical sensor 11a includes a support film 13, a thermoelectric conversion material portion 12, a heat sink 14, an infrared absorption film 23 as a light absorption film, a first electrode 24, and a second electrode 25. The optical sensor 11a detects a potential difference occurring between the first electrode 24 and the second electrode 25 to thereby detect infrared rays irradiated to the optical sensor 11a. When the optical sensor 11a as a whole is of a plate shape, the thickness direction thereof is indicated by the Z direction.

The support film 13 is of a thin film shape. In the present embodiment, the support film 13 has a rectangular shape as viewed in the thickness direction (Z direction) The support film 13 supports the thermoelectric conversion material portion 12, the infrared absorption film 23, the first electrode 24, and the second electrode 25. The support film 13 includes one main surface 13h located on one side in the thickness direction, and another main surface 13a located on the other side in the thickness direction. Other configurations of the support film 13 will be described in detail later.

The heat sink 14 includes one surface 14a and another surface 14b arranged apart from each other in the thickness direction of the optical sensor 11a. The heat sink 14 is arranged on the other main surface 13a of the support film 13. More specifically, the heat sink 14 is arranged such that the one surface 14a of the heat sink 14 contacts the other main surface 13a of the support film 13. The other surface 14b of the heat sink 14 is exposed. In the present embodiment, the heat sink 14 has an annular shape. An outer edge 14c of the entire heat sink 14 and an outer edge 13c of the support film 13 extend continuously in the Z direction. In the cross section illustrated in FIG. 3, the heat sink 14 is expressed as two trapezoidal shapes arranged apart from each other in the X direction. The heat sink 14 is sufficiently thick compared to the support film 13, For example, the thickness of the heat sink 14 is at least ten times the thickness of the support film 13. In the present embodiment, the heat sink 14 is a so-called substrate. The heat sink 14 is formed of, for example, silicon (Si).

The optical sensor 11a has a recess 16 formed to be concave in the thickness direction. In a region corresponding to the recess 16 as viewed from the other surface 14h side, the support film 13, more specifically the other main surface 13a of the support film 13, is exposed. In FIG. 1, the long dashed short dashed line indicates an inner edge 16a of the heat sink 14, which is a boundary between the heat sink 14 and the support film 13, as viewed in the thickness direction (Z direction) of the optical sensor 11a. As shown in FIG. 1, in the present embodiment, the inner edge 16a of the heat sink 14 has a square shape as viewed in the thickness direction of the support film 13. The heat sink 14 is arranged to surround the recess 16. An inner peripheral surface 14d of the heat sink 14 surrounding the recess 16 is of a so-called tapered shape, which is wider on an opening side located on the surface 14b side. The recess 16 is formed, for example, by subjecting a plate-shaped substrate to anisotropic wet etching. The recess 16 thus formed can suppress the escape of heat from the infrared absorption film 23 to the heat sink 14. This can further increase a temperature difference in the longitudinal direction of first material layers 21 and second material layers 22, which will be described later.

The first electrode 24 and the second electrode 25 are arranged on the one main surface 13b of the support film 13, outside a region 15 which will be described later. The second electrode 25 is arranged separate from the first electrode 24. The first electrode 24 and the second electrode 25 are each, for example, a pad electrode. For the material of each of the first electrode 24 and the second electrode 25, gold (Au), titanium (Ti), platinum (Pt), or the like, for example, is adopted.

The thermoelectric conversion material portion 12 is arranged on the one main surface 13b of the support film 13. The thermoelectric conversion material portion 12 includes a plurality of first material layers 21, including first material layers 21a, 21b, 21c, and 21d, and a plurality of second material layers 22, including second material layers 22a, 22b, 22c, and 22d. The first material layers 21 and the second material layers 22 included in the thermoelectric conversion material portion 12 are each formed of SiGe. That is, the first material layers 21 and the second material layers 22 are each formed of a compound semiconductor containing Si and Ge as constituent elements. The first material layers 21 are formed of a thermoelectric conversion material of n type as a first conductivity type. The second material layers 22 are formed of a thermoelectric conversion material of p type as a second conductivity type different from the first conductivity type.

A first material layer 21 has a strip shape. The first material layer 21 includes a first region 28a, which includes a first end 28c located on one side in the longitudinal direction, and a second region 28b, which includes a second end 28d located on the other side in the longitudinal direction. The direction in which a line connecting the first region 28a and the second region 28b extends is the longitudinal direction of the strip-shaped first material layer 21.

The first material layers 21 are arranged on the one main surface 13b of the support film 13. The first material layers 21 are arranged to fit within the region 15 indicated by the long dashed double-short dashed rectangular shape in FIG. 1. The plurality of first material layers 21 are arranged spaced apart from each other. Except for the first material layers 21a, 21b, 21c, and 21d, the first material layers 21 are each arranged such that the longitudinal direction coincides with the X or Y direction. Except for the first material layers 21a, 211, 21c, and 21d, the first material layers 21 are each arranged to extend from one side toward the opposite side of the square region 15 (such that the longitudinal direction coincides with that direction). As viewed in the thickness direction of the support film 13, the first material layers 21 are each arranged such that the first region 28a is located on the side close to the inner edge 16a of the heat sink 14 and the second region 28b is located on the side close to the outer edge 23a of the infrared absorption film 23.

The thermoelectric conversion material portion 12 includes an insulating film 26. For the material of the insulating film 26, SiO$_2$, for example, is selected. The insulating film 26 is arranged on the first material layers 21 in the portion where the first material layers 21 are disposed, and arranged on the one main surface 13b of the support film 13 in the portion where the first material layers 21 are not disposed. The insulating film 26 is arranged so as not to cover the first region 28a and the second region 28b of the first material layers 21.

A second material layer 22, similar to the first material layer 21, has a strip shape. The second material layer 22 includes a third region 29a, Which includes a third end 29c located on one side in the longitudinal direction, and a fourth region 29b, which includes a fourth end 29d located on the other side in the longitudinal direction. The direction in which a line connecting the third region 29a and the fourth region 29b extends is the longitudinal direction of the strip-shaped second material layer 22.

The second material layers 22, similar to the first material layers 21, are arranged to fit within the region 15 indicated by the long dashed double-short dashed rectangular shape in FIG. 1. The plurality of second material layers 22 are each arranged such that the longitudinal direction is inclined with respect to the X or Y direction. The second material layers 22 are each arranged on a portion of the one main surface 13b of the support film 13, on a portion of the insulating film 26, and on a portion of the first material layer 21. As viewed in the thickness direction of the support film 13, the second material layers 22 are each arranged such that the third region 29a is located on the side close to the inner edge 16a of the heat sink 14 and the fourth region 29b is located on the side close to the outer edge 23a of the infrared absorption film 23.

The plurality of first material layers 21 and the plurality of second material layers 22 are alternately connected, except for the first region 28a connected to the first electrode 24 and the third region 29a connected to the second electrode 25. More specifically, a first material layer 21 has its first region 28a connected to the third region 29a of a second material layer 22 that is adjacent to the first material layer 21 on one side. The first material layer 21 has its second region 28b connected to the fourth region 29b of a second material layer 22 that is adjacent to the first material layer 21 on the other side. The first material layers 21 and the second material layers 22 have the second regions 28h and the fourth regions 29b connected to each other and the first regions 28a and the third regions 29a connected to each other, except for the first region 28a connected to the first electrode 24 and the third region 29a connected to the second electrode 25. That is, with a first material layer 21 and a second material layer 22 making a pair, the adjacent first and second material layers 21 and 22 are electrically connected in series alternately at the regions including their ends. In the present embodiment, the third region 29a is disposed on the first region 28a, and the fourth region 29b is disposed on the second region 28b. With respect to the direction of the temperature gradient generated when light is irradiated onto the optical sensor more specifically onto the infrared absorption film 23, the voltage generated in the first region 28a including the first end 28c located on one side of the first material layer 21 and the voltage generated in the third region 29a including the third end 29c located on one side of the second material layer 22 have their polarities opposite to each other.

Of the alternately connected first material layers 21 and second material layers 22, the first material layer 21 arranged at the most end has its first region 28a connected to the first electrode 24. Of the alternately connected first material layers 21 and second material layers 22, the second material layer 22 located at the most end has its third region 29a connected to the second electrode 25.

The infrared absorption film 23 converts infrared rays into heat. For the material of the infrared absorption film 23, carbon (C), for example, is selected.

As viewed in the thickness direction of the support film 13, the infrared absorption film 23 is arranged in a region surrounded by the inner edge 16a of the heat sink 14. In the present embodiment, as viewed in the thickness direction of the support film 13, the outer edge 23a of the infrared absorption film 23 has a square shape. The infrared absorption film 23 is arranged such that the center of the square shape formed by the outer edge 23a of the infrared absorption film 23 coincides with the center of the square shape formed by the inner edge 16a of the heat sink 14.

The infrared absorption film 23 is arranged so as to form a temperature difference in the longitudinal direction of each first material layer 21, more specifically between the first region 28a and the second region 28b. Further, the infrared absorption film 23 is arranged so as to form a temperature difference in the longitudinal direction of each second material layer 22, more specifically between the third region 29a and the fourth region 29b. In the present embodiment, the infrared absorption film 23 is arranged to expose the first regions 28a of the first material layers 21 and the third regions 29a of the second material layers 22 and to cover the second regions 28b of the first material layers 21 and the fourth regions 29b of the second material layers 22. That is, each connecting portion where the second region 28b and the fourth region 29b are connected overlaps the infrared absorption film 23 as viewed in the thickness direction of the support film 13. The first regions 28a of the first material layers 21 and the third regions 29a of the second material layers 22 are not covered with the infrared absorption film 23. The first material layers 21 and the second material layers 22 are each thermally connected to the infrared absorption film 23 so as to form a temperature difference in the longitudinal direction of each of the first and second material layers 21 and 22, The infrared absorption film 23 is arranged such that the heat of the infrared absorption film 23 is actively propagated to the second regions 28b of the first material layers 21 and the fourth regions 29b of the second material layers 22.

The first material layers 21 convert temperature differences (thermal energy) between the first and second regions 28a and 28b into electrical energy. The second material layers 22 convert temperature differences (thermal energy) between the third and fourth regions 29a and 29h into electrical energy. A temperature difference is formed in the longitudinal direction in each of the first material layers 21 and the second material layers 22. The thermoelectric conversion material portion 12, with the first material layers 21 and the second material layers 22 configured as described above, converts the temperature differences (thermal energy) into electrical energy. The optical sensor 11a can detect infrared rays by efficiently using the temperature differences formed by the infrared absorption film 23 and the heat sink 14.

A specific configuration of the support film 13 will now be described. The support film 13 includes a first layer 17 arranged in contact with the heat sink 14 and an insulating second layer 18 arranged on the first layer 17. The first layer 17 includes one main surface 17b located on one side in the thickness direction, and another main surface 17a located on the other side in the thickness direction. The other main surface 17a in the thickness direction of the first layer 17 is the other main surface 13a in the thickness direction of the support film 13. The second layer 18 includes one main surface 18b located on one side in the thickness direction, and another main surface 18a located on the other side in the thickness direction. The one main surface 18b in the thickness direction of the second layer 18 is the one main surface 13b in the thickness direction of the support film 13. The one main surface 17h of the first layer 17 is in contact with the other main surface 18a of the second layer 18.

The first layer 17 has a thickness $T_1$ of not less than 100 nm and not more than 2000 nm. In the present embodiment, the thickness $T_1$ of the first layer 17 is 700 nm. The second layer 18 has a thickness $T_2$ of more than 0 nm and not more than 200 nm. In the present embodiment, the thickness $T_2$ of the second layer 18 is 10 nm.

Figure 6:
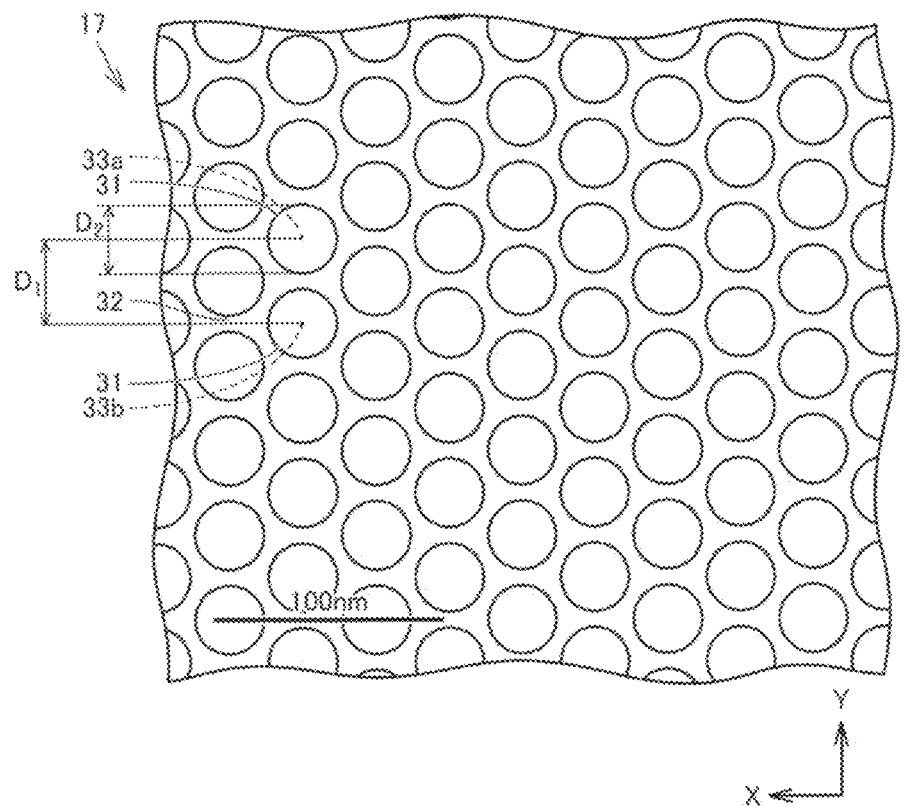
FIG. 6 is a schematic diagram showing in enlarged view a portion of a first layer configured with a phononic structure.

Here, the first layer 17 is configured with a phononic structure having a large number of holes 31. The large number of holes 31 means that the holes 31 have an areal density of 25 to 2500 holes/$\mu m^2$. FIG. 6 is a schematic diagram showing in enlarged view a portion of the first layer 17 configured with the phononic structure. FIG. 6 illustrates the first layer 17 as viewed in the Z direction. Referring also to FIG. 6, the first layer 17 is configured with the phononic structure having a large number of holes 31. Although the holes 31 are illustrated to have an outer shape of perfect circle in the schematic diagram in FIG. 6 for ease of understanding, the outer shape of the holes 31 is not limited to a strictly perfect circle; it may be elliptical or polygonal. The first layer 17 has a lame number of holes 31 formed spaced apart from each other in a sheet-shaped base portion 32. The material for the first layer 17 is $SiO_2$ or SiN. The first layer 17 can be formed, for example, by forming a resist pattern and vapor-depositing a vapor deposition material. This will be described later.

The holes 31 have a pitch spacing $D_1$, as indicated by a length $D_1$ in FIG. 6, of not less than 20 nm and not more than 200 nm. In the present embodiment, the pitch spacing $D_1$ of the holes 31 is 40 nm. The pitch spacing $D_1$ of the holes 31 is a spacing between the centers 33a and 33b of the neighboring holes 31. Further, the holes 31 have a diameter $D_2$, as indicated in FIG. 6, of not less than 10 nm and not more than 100 nm. In the present embodiment, the diameter $D_2$ of the holes 31 is 15 nm.

Figure 7:
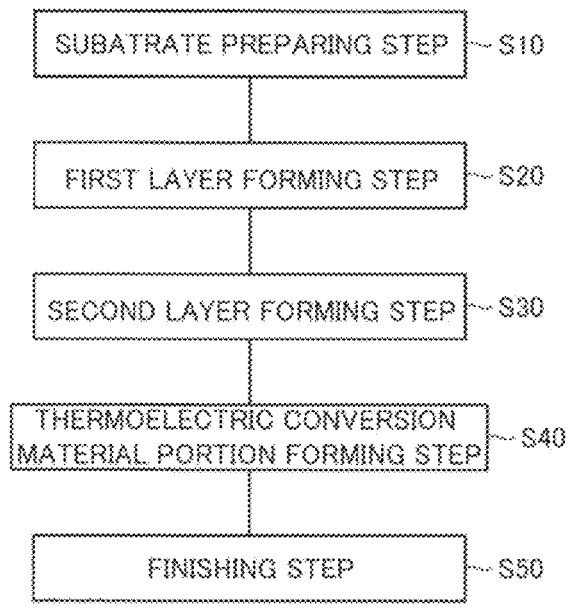
FIG. 7 is a flowchart illustrating typical steps of an optical sensor producing method in Embodiment 1.

A method of producing the optical sensor 11a in Embodiment 1 will now be described in brief. FIG. 7 is a flowchart illustrating typical steps of the method of producing the optical sensor 11a in Embodiment 1. Referring to FIG. 7, in the method of producing the optical sensor 11a in Embodiment 1, a substrate preparing step is performed as a step S10. In this step S10, firstly, a flat plate-shaped substrate is prepared, which is made of Si and becomes a base of the heat sink 14.

Next, a first layer forming step is performed as a step S20. In this step S20, a phononic structure is drawn on the substrate with ion beams (EB) to form a resist pattern. Thereafter, a first layer 17 is formed, which is an insulating layer containing Si such as $SiO_2$, SiN, or the like.

Figure 8:
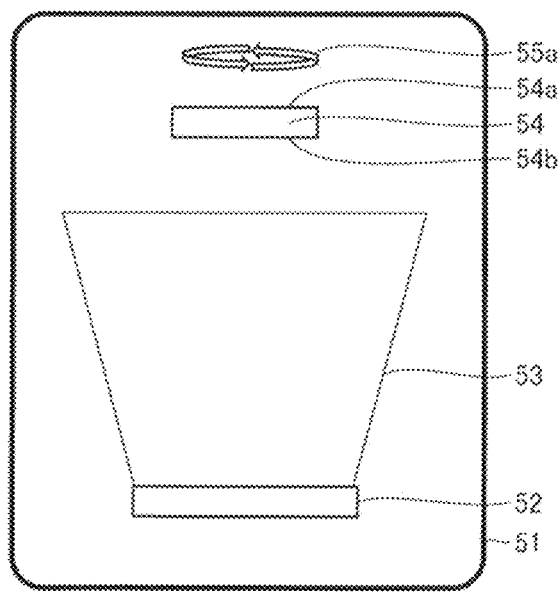
FIG. 8 is a schematic diagram illustrating a setting for forming the first layer.

FIG. 8 is a schematic diagram illustrating a setting for forming the first layer 17. Referring to FIG. 8, a substrate 54 includes a first surface 54a located on one side in the thickness direction, and a second surface 54h located on the other side in the thickness direction. The support film 13 is to be formed on the second surface 54b of the substrate 54. In a chamber 51, with the second surface 54b of the substrate 54 facing a vapor deposition material ejecting portion 52, a vapor deposition material 53 is ejected from the vapor deposition material ejecting portion 52 while the substrate 54 is being rotated along the arrows 55a, whereby $SiO_2$ or SiN as the vapor deposition material 53 is vapor-deposited on the second surface 54h. At this time, the vapor deposition is carried out with the vapor deposition material ejecting portion 52 and the substrate 54 being in parallel. Thereafter, lift-off is carried out to form the first layer 17 included in the support film 13, It should be noted that the vapor deposition material ejecting portion 52 and the substrate 54 do not have to be in parallel; the substrate 54 may be slightly inclined with respect to the vapor deposition material ejecting portion 52.

Figure 9:
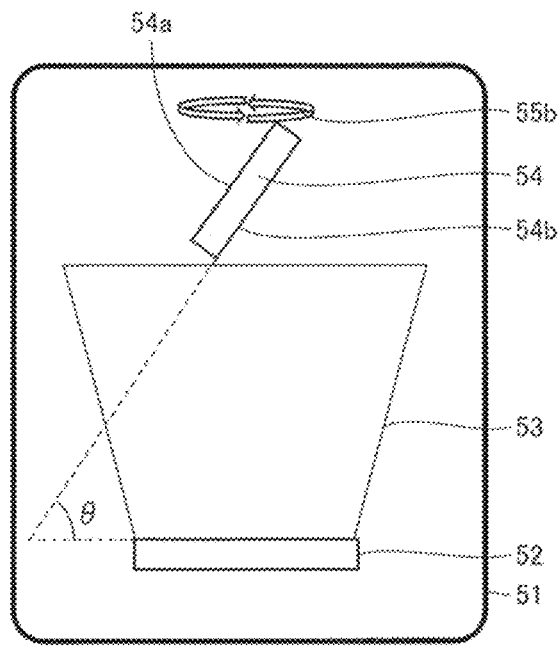
FIG. 9 is a schematic diagram illustrating a setting for forming a second layer.

Next, a second layer forming step is performed as a step S30. In this step S30, the vapor deposition material 53 ejected from the vapor deposition material ejecting portion 52 is vapor-deposited while the substrate 54 inclined at a large angle is being rotated. FIG. 9 is a schematic diagram illustrating a setting for forming the second layer 18. Referring to FIG. 9, in the chamber 51, in the state where the second surface 54b of the substrate 54 faces the vapor deposition material ejecting portion 52, the vapor deposition material 53, such as $SiO_2$ or SiN, ejected from the vapor deposition material ejecting portion 52 is vapor-deposited while the substrate 54 is being rotated along the arrows 55b. At this time, the angle θ between the vapor deposition material ejecting portion 52 and the second surface 54b of the substrate 54 is set at a large angle, specifically at least 45 degrees, for example. By thus vapor-depositing the vapor deposition material 53 on the first layer 17 in the state where the substrate 54 is inclined at a large angle, the second layer 18 can be formed efficiently on the first layer 17 with a large number of holes 31 formed therein. In this manner, the second layer 18 is formed on the first layer 17. Accordingly, the support film 13 is formed.

Thereafter, a thermoelectric conversion material portion forming step is performed as a step S40. In this step S40, the thermoelectric conversion material portion 12 is formed on the second layer 18. Specifically, for example, the first material layers 21, the layer of insulating film 26, and the second material layers 22 are formed in this order. For formation of each layer, resist coating, photolithography, vapor deposition, and lift-off, for example, are used. Thereafter, a finishing step is performed as a step S50. This step S50 includes a step of forming the infrared absorption film 23, a step of forming the first electrode 24 and the second electrode 25, and a step of forming the recess 16 by anisotropic etching. In this manner, the optical sensor 11a of the above configuration is obtained.

According to the optical sensor 11a of such a configuration, the support film 13 includes the insulating second layer 18, allowing the thermoelectric conversion material portion 12 arranged on the second layer 18 to be reliably supported. Further, the first layer 17 is configured with the phononic structure having a large number of holes. By the first layer 17 included in the support film 13 thus including the phononic structure, the thermal conductivity as the support film 13 can be reduced. Such an optical sensor 11a can therefore be improved in sensitivity.

In the present embodiment, the second layer 18 is formed of a material containing Si. Such a material can easily secure insulating properties.

In the present embodiment, the second layer 18 is formed of $SiO_2$ or SiN. Such materials are suitable for the insulating second layer 18 included in the support film 13 of the optical sensor 11a.

In the present embodiment, the second layer 18 has a thickness of more than 0 nm and not more than 200 nm. This can improve the sensitivity while securing a high yield during the production of the optical sensor 11a. It is therefore possible to achieve both improved sensitivity and good productivity of the optical sensor 11a.

Figure 10:
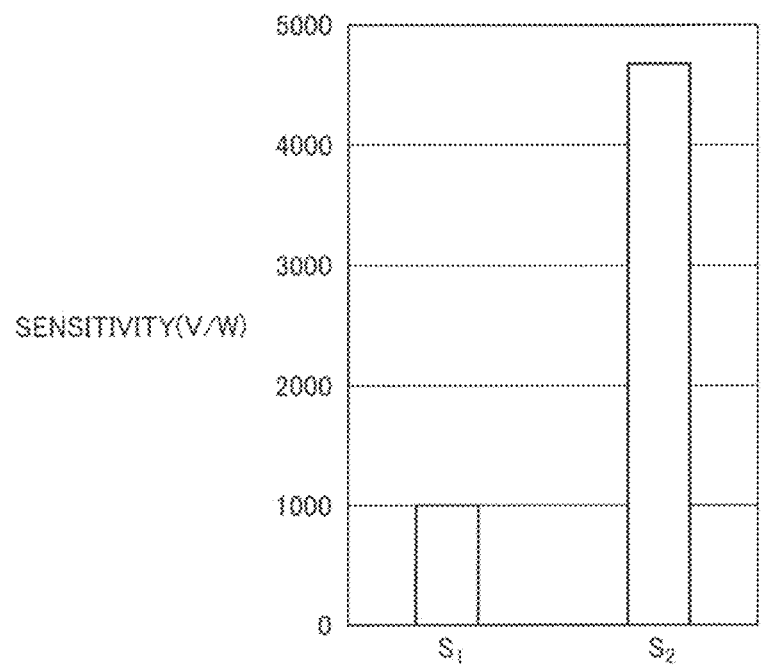
FIG. 10 is a graph illustrating a difference in sensitivity between the optical sensor in Embodiment 1 and an optical sensor having a support film composed only of the second layer.

The sensitivity of the optical sensor 11a in Embodiment 1 described above will now be described. FIG. 10 is a graph illustrating a difference in sensitivity between the optical sensor 11a in Embodiment 1 and an optical sensor in which the support film 13 is formed only of the second layer 18. The vertical axis represents sensitivity (V/W) of the optical sensors. The sensitivity of the optical sensor 11a in Embodiment 1 is indicated as $S_2$, and the sensitivity of the optical sensor with the support film 13 formed only of the second layer 18 is indicated as St. Referring to FIG. 10, under certain measurement conditions, the sensitivity of the optical sensor including no first layer, i.e. no phononic structure, is 1000 V/W as indicated by $S_1$. In comparison, under the same measurement conditions, the sensitivity of the optical sensor 11a in Embodiment 1 is 4680 V/W as indicated by $S_2$. That is, it can be understood that the sensitivity of the optical sensor 11a in Embodiment 1 is improved by about 4.7 times compared to the sensitivity of the optical sensor having no first layer.

It should be noted that the sensitivity of an optical sensor is measured according to how much voltage is detected with respect to infrared rays ($W/m^2$) irradiated from a thermal light source (filament). For the thermal light source, SA10510-8M3 (manufactured by Cal Sensors Inc.) was used, and the measurement was conducted with the voltage of 2.2 V and the current of 1.1 A, at a distance of 7 cm.

Figure 11:
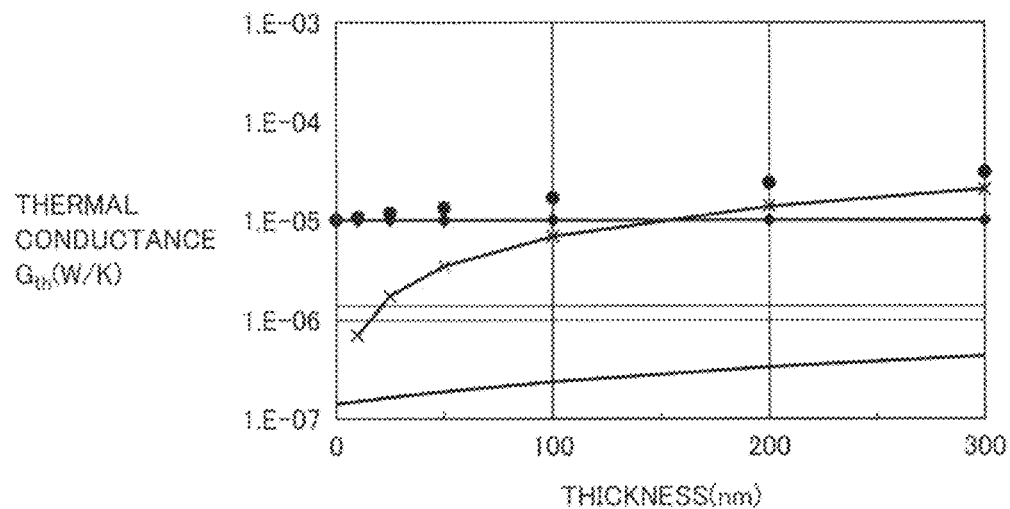
FIG. 11 is a graph illustrating a relationship between the thickness of layers and thermal conductance.

FIG. 11 is a graph illustrating a relationship between the thickness of layers and thermal conductance. The horizontal axis represents the thickness of each layer (nm), and the vertical axis represents thermal conductance (W/K). In FIG. 11, an x indicates the thickness of the second layer, a rhombus indicates the thickness of the first layer, and a circle indicates the total sum. Referring to FIG. 11, in the first layer having the phononic structure, the thermal conductance is constant at $1.0 \times 10^5$ W/K, irrespective of the layer thicknesses. In contrast, it can be understood that in the second layer, the thermal conductance increases with increasing thickness and the thermal conductance exceeds that of the first layer when the thickness of the second layer becomes 150 nm or more.

While the thickness $T_2$ of the second layer 18 is set to be more than 0 nm and not more than 200 nm in the above embodiment, not limited thereto, the thickness $T_2$ of the second layer 18 may be not less than 10 nm and not more than 50 nm. This makes it possible to more reliably achieve both improved sensitivity and good productivity of the optical sensor.

Figure 12:
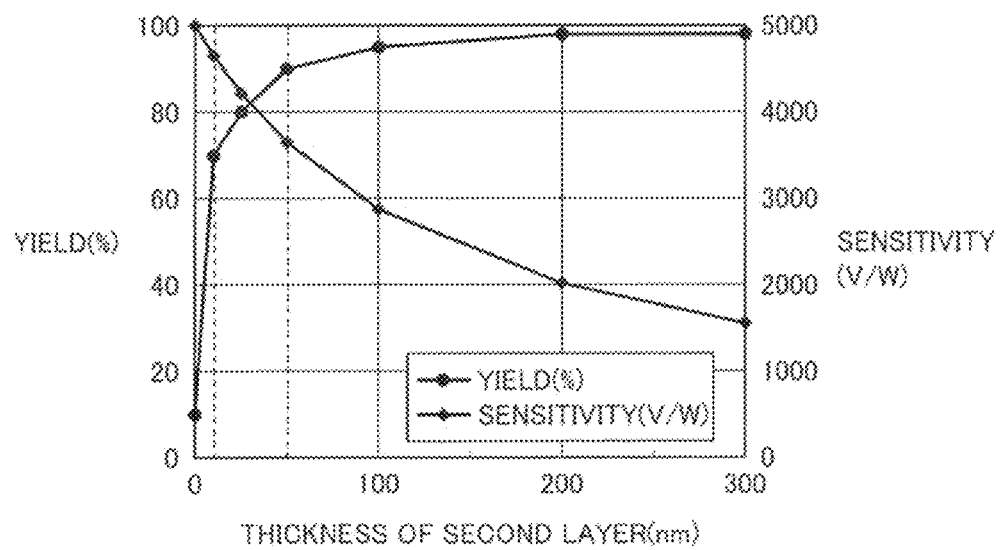
FIG. 12 is a graph illustrating a relationship of yield and optical sensor sensitivity with the thickness of the second layer.

FIG. 12 is a graph illustrating a relationship of the yield and the sensitivity of the optical sensor with respect to the thickness of the second layer. The horizontal axis represents the thickness (nm) of the second layer, the vertical axis on the left represents the yield (%), and the vertical axis on the right represents the sensitivity (V/W) of the optical sensor. The higher yield means the better productivity. In FIG. 12, a circle indicates the yield, and a rhombus indicates the sensitivity of the optical sensor. Referring to FIG. 12, although the sensitivity is better with the thinner second layer, the yield deteriorates correspondingly. By setting the thickness of the second layer to be not less than 10 nm and not more than 50 nm, the sensitivity of the optical sensor can be made 3500 V/W or more, while securing the yield of 70% or more. That is, setting the thickness of the second layer to be not less than 10 nm and not more than 50 nm can more reliably achieve both the improved sensitivity and good productivity of the optical sensor.

Embodiment 2

Figure 13:
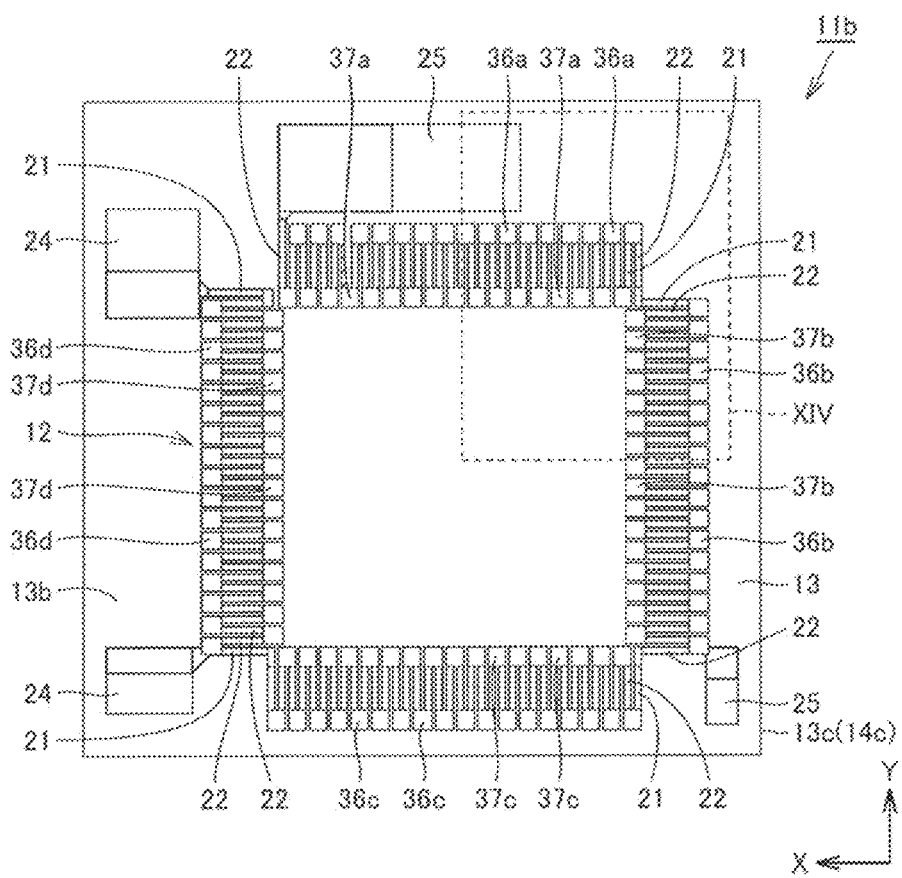
FIG. 13 is a schematic plan view of the appearance of an optical sensor in Embodiment 2.
Figure 14:
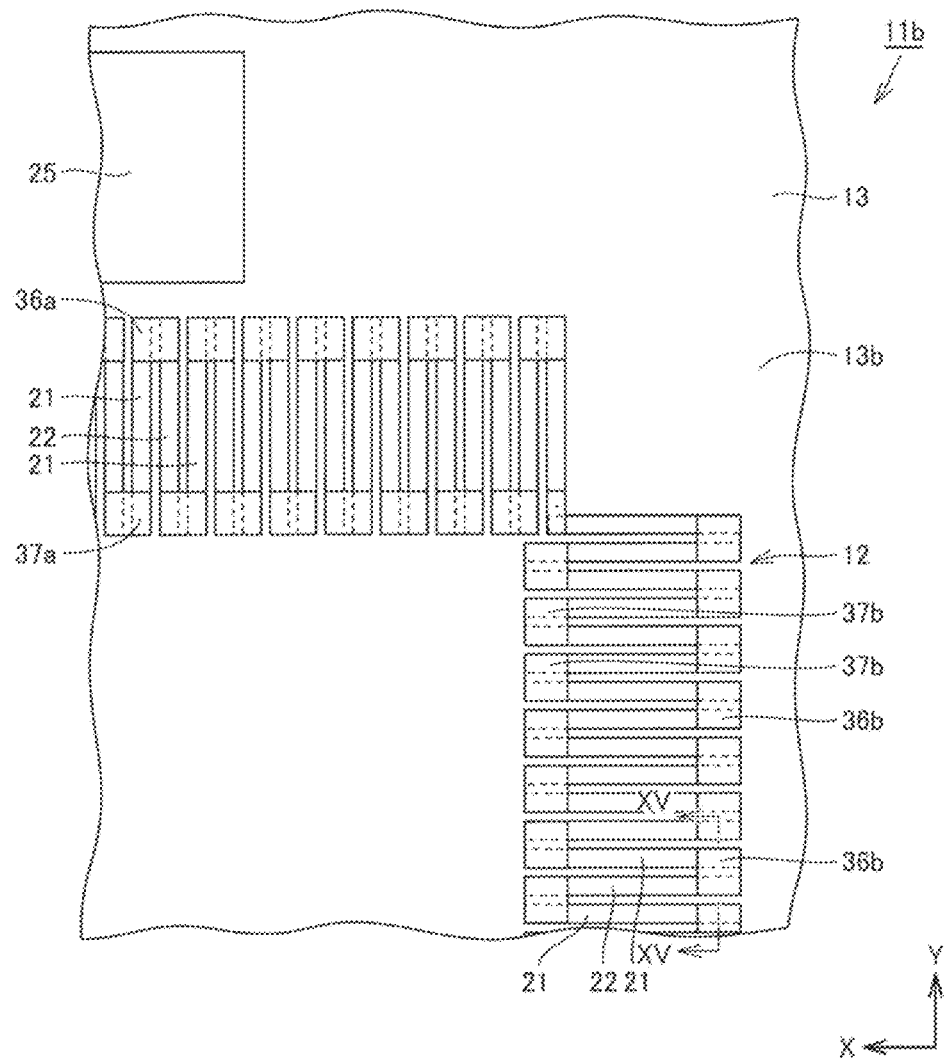
FIG. 14 is an enlarged schematic plan view of a partial region XIV of the optical sensor shown in FIG. 13.
Figure 15:
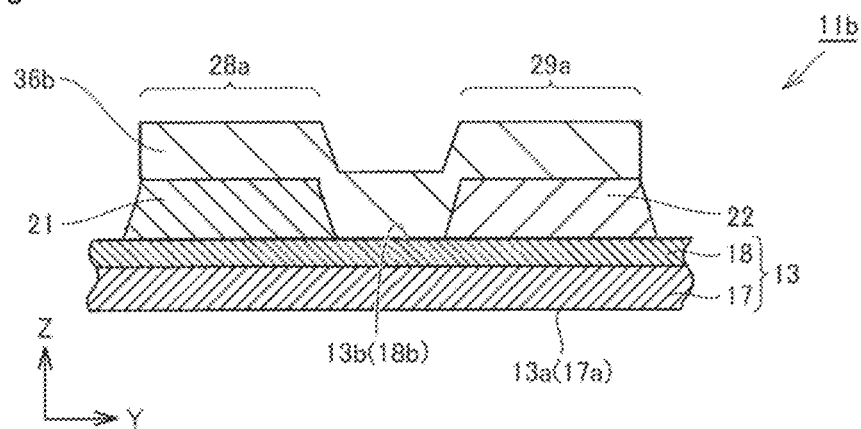
FIG. 15 is a schematic cross-sectional view taken along the line XV-XV in FIG. 14.

Another embodiment, Embodiment 2, will now be described. FIG. 13 is a schematic plan view of the appearance of an optical sensor in Embodiment 2. FIG. 14 is an enlarged schematic plan view of a partial region XIV of the optical sensor shown in FIG. 13. FIG. 15 is a schematic cross-sectional view taken along the line XV-XV in FIG. 14. For ease of understanding, the infrared absorption film and the insulating film are not illustrated in FIGS. 13, 14, and 15. FIG. 13 corresponds to FIG. 1.

Referring to FIGS. 13, 14, and 15, the optical sensor 11b in Embodiment 2 includes first material layers 21 and second material layers 22 that are arranged on a same plane, specifically on the support film 13, different from the case of the optical sensor 11a in Embodiment 1 in which the first and second material layers are arranged partially overlapped in the thickness direction. The strip-shaped first material layers 21 and the strip-shaped second material layers 22 are each arranged on the support film 13 such that its longitudinal direction coincides with the X or Y direction. The first material layers 21 and the second material layers 22 are alternately arranged spaced apart from each other.

The thermoelectric conversion material portion 12 includes a plurality of third material layers 36a, 36b, 36c, 36d, 37a, 37b, 37c, and 37d formed of metal. Examples of the metal constituting the third material layers 36a, 36b, 36c, 36d, 37a, 37b, 37c, and 37d include nickel (Ni), tungsten (W), molybdenum (Mo), titanium (Ti), gold (Au), palladium (Pd), germanium (Ge), hafnium (Hf), and aluminum (Al). The third material layers 36a, 36h, 36c, and 36d are each arranged on the outer edge sides of the first material layer 21 and the second material layer 22, to extend across, and in contact with, the neighboring first and third regions 28a and 29a, More specifically, in the present embodiment, the third material layers 36a, 36b, 36c, and 36d are each arranged to cover a first region 28a, a third region 29a, a portion of the side face of the first region 28a, and a portion of the side face of the third region 29a. The third material layers 37a, 37b, 37c, and 37d are each arranged on the inner edge sides of the first material layer 21 and the second material layer 22, to extend across, and in contact with, the neighboring second and fourth regions 28b and 29b.

The support film 13 includes a first layer 17 arranged on the heat sink 14 side in the thickness direction and configured with a phononic structure having a large number of holes, and an insulating second layer 18 arranged on the first layer 17 and in contact with the thermoelectric conversion material portion 12.

According to the present embodiment, the third material layers 36a, 36b, 36c, 36d, 37a, 37b, 37c, and 37d with good conductivity can improve the electrical conductivity between the first and second material layers 21 and 22. Therefore, the sensitivity of the optical sensor 11b can also be improved with such a configuration. It should be noted that the optical sensor 11b in Embodiment 2 is formed by firstly forming the first material layers 21 and the second material layers 22, and then removing, by dry etching, the oxide films formed on the first and second material layers 21 and 22.

OTHER EMBODIMENTS

While the support film 13 is configured with the first layer 17 and the second layer 18 in the above-described embodiments, not limited thereto, two second layers 18 may be configured to sandwich a first layer 17 therebetween, for example.

Alternatively, the support film 13 may be configured to further include a third layer different from the first and second layers 17 and 18. Still alternatively, a plurality of first layers 17 may be stacked one on another.

Further, while the first layer 17 and the second layer 18 are formed over the entire surface of the support film 13 in the thickness direction in the above-described embodiments, not limited thereto, the first layer 17 and the second layer 18 may be formed for a portion of the support film 13 as viewed in the thickness direction.

It should be noted that in the above-described embodiments, either one or both of the first material layers and the second material layers may be formed of SiGe that has at least one of an amorphous structure and a nanocrystalline structure with a grain size of not less than 3 nm and not more than 200 nm. This can improve the thermoelectric conversion efficiency. Therefore, the sensitivity can be improved.

For the measurement of the grain size of the crystals, transmission electron microscope (TEM) images were observed. For the device, JEM-2100F (manufactured by JOEL Ltd.) was used, at an acceleration voltage of 200 kV. The electronic probe diameter of 0.2 nm was used, and for the EDX mapping conditions, the pixel count was 256 pixels×256 pixels, the dwell time was 0.5 ms/pixel, and the number of integrations was 15.

Further, for SiGe as the constituent material of the first and second material layers 21 and 22, SiGe of the amorphous structure, for example, may be heat-treated at a temperature of, e.g., about 500° C. to create a nanocrystalline structure in a portion thereof. SiGe may have a nanocrystalline structure or an amorphous structure. SiGe may be polycrystalline. Such SiGe as a polycrystal is also suitably used for the optical sensor of the present disclosure. The polycrystal in the optical sensor of the present disclosure has the crystallinity of 99% or more. The crystallinity was measured as follows. The device used was HORIBA LabRAM HR-PL. For the measurement conditions, the laser wavelength was 532 nm and the laser power was 2.5 mW. For the analysis condition, a peak around 400 cm$^{-1}$ was analyzed. For the analysis, the Gaussian function and the pseudo-Voigt function were fitted. The Gaussian function G(x) is expressed by the expression shown in Math. 2 below $$G(x) = A_g \exp\left(-\frac{4\ln 2}{W_g^2}(x - x_g)^2\right) \quad \text{[Math. 2]}$$

The pseudo-Voigt function F(x) is expressed by the expression shown in Math. 3 below.

$$F(x) = A_F \frac{m}{\pi}\left[\frac{W_f}{(x - x_f)^2 + W_f^2}\right] + A_F \frac{1-m}{\sqrt{2\pi}W_f}\exp\left[-\frac{(x - x_f)^2}{2W_f^2}\right] \quad \text{[Math. 3]}$$

In the Gaussian function G(x) with variables $A_g$, $W_g$, and $x_g$, the initial value of $x_0$ was set to 400 cm$^{-1}$. In the pseudo-Voigt function F(x) with variables $A_f$, $W_f$, $x_f$, and m, the initial value of $x_0$ was set to 380 cm$^{-1}$, and g was set to 0.5. Each parameter was optimized with the least squares method, and the pseudo-Voigt function and the Gaussian function were integrated to obtain an area. The crystallinity was calculated, assuming that the area derived using the Gaussian function corresponds to that of the amorphous phase and the area derived using the pseudo-Voigt function corresponds to that of the crystalline phase, by using the following equation:

Crystallinity=Area derived using pseudo-Voigt function/(Area derived using pseudo-Voigt function+ Area derived using Gaussian function)

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

What is claimed is:
1. An optical sensor comprising:
a support film;
a thermoelectric conversion material portion arranged on one main surface of the support film and operative to convert thermal energy into electrical energy;
a heat sink arranged on another main surface of the support film;

a light absorption film operative to convert light energy of received light into thermal energy;
a first electrode electrically connected to the thermoelectric conversion material portion; and
a second electrode arranged separate from the first electrode and electrically connected to the thermoelectric conversion material portion;
the thermoelectric conversion material portion including
a plurality of strip-shaped first material layers formed of SiGe having a first conductivity type and operative to convert thermal energy into electrical energy, and
a plurality of strip-shaped second material layers formed of SiGe having a second conductivity type different from the first conductivity type and operative to convert thermal energy into electrical energy,
each of the first material layers including
a first region including a first end located on one side in a longitudinal direction, and
a second region including a second end located on another side in the longitudinal direction;
each of the second material layers including
a third region including a third end located on one side in a longitudinal direction, and
a fourth region including a fourth end located on another side in the longitudinal direction,
the first electrode being electrically connected to the first region of one of the plurality of first material layers,
the second electrode being electrically connected to the third region of one of the plurality of second material layers,
the plurality of first material layers and the plurality of second material layers being alternately arranged in series in such a manner that, except for the first region of the first material layer connected to the first electrode and the third region of the second material layer connected to the second electrode, the first region and the third region are electrically connected to each other and the second region and the fourth region are electrically connected to each other,
the light absorption film being arranged to form a temperature difference in the longitudinal direction in each of the first and second material layers,
the support film including
a first layer arranged on the heat sink side in a thickness direction and configured with a phononic structure having a large number of holes, and
an insulating second layer arranged on the first layer and in contact with the thermoelectric conversion material portion.

2. The optical sensor according to claim 1, wherein the second layer is formed of a material containing Si.

3. The optical sensor according to claim 2, wherein the second layer is formed of $SiO_2$ or SiN.

4. The optical sensor according to claim 1, wherein the second layer has a thickness of more than 0 nm and not more than 200 nm.

5. The optical sensor according to claim 4, wherein the thickness of the second layer is not less than 10 nm and not more than 50 nm.

6. The optical sensor according to claim 1, wherein either one or both of the first material layers and the second material layers are formed of SiGe having at least one of an amorphous structure and a nanocrystalline structure having a grain size of not less than 3 nm and not more than 200 nm.

7. The optical sensor according to claim 1, wherein either one or both of the first material layers and the second material layers are formed of polycrystalline SiGe.

8. The optical sensor according to claim 1, wherein
the phononic structure is configured with an insulating film containing Si, and
the holes have a pitch spacing of not less than 20 nm and not more than 200 nm.

9. The optical sensor according to claim 1, wherein the holes have a diameter of not less than 10 nm and not more than 100 nm.

10. The optical sensor according to claim 1, wherein
the thermoelectric conversion material portion includes a plurality of third material layers formed of metal, and
the third material layers are each arranged to contact the first and third regions or to contact the second and fourth regions.

11. The optical sensor according to claim 2, wherein either one or both of the first material layers and the second material layers are formed of SiGe having at least one of an amorphous structure and a nanocrystalline structure having a grain size of not less than 3 nm and not more than 200 nm.

12. The optical sensor according to claim 3, wherein either one or both of the first material layers and the second material layers are formed of SiGe having at least one of an amorphous structure and a nanocrystalline structure having a grain size of not less than 3 nm and not more than 200 nm.

13. The optical sensor according to claim 4, wherein either one or both of the first material layers and the second material layers are formed of SiGe having at least one of an amorphous structure and a nanocrystalline structure having a grain size of not less than 3 nm and not more than 200 nm.

14. The optical sensor according to claim 5, wherein either one or both of the first material layers and the second material layers are formed of SiGe having at least one of an amorphous structure and a nanocrystalline structure having a grain size of not less than 3 nm and not more than 200 nm.

15. The optical sensor according to claim 2, wherein either one or both of the first material layers and the second material layers are formed of polycrystalline SiGe.

16. The optical sensor according to claim 3, wherein either one or both of the first material layers and the second material layers are formed of polycrystalline SiGe.

17. The optical sensor according to claim 4, wherein either one or both of the first material layers and the second material layers are formed of polycrystalline SiGe.

18. The optical sensor according to claim 1, wherein
the second layer is formed of $SiO_2$ or SiN,
the second layer has a thickness of not less than 10 nm and not more than 50 nm,
either one or both of the first material layers and the second material layers are formed of SiGe having at least one of an amorphous structure and a nanocrystalline structure having a grain size of not less than 3 nm and not more than 200 nm,
the phononic structure is configured with an insulating film containing Si,
the holes have a pitch spacing of not less than 20 nm and not more than 200 nm,
the holes have a diameter of not less than 10 nm and not more than 100 nm,
the thermoelectric conversion material portion includes a plurality of third material layers formed of metal, and
the third material layers are each arranged to contact the first and third regions or to contact the second and fourth regions.

* * * * *